(12) United States Patent
Chen et al.

(10) Patent No.: US 12,044,567 B2
(45) Date of Patent: Jul. 23, 2024

(54) DETECTION DEVICE AND MANUFACTURING METHOD THEREOF COMPRISING AN INSULATING LAYER DISPOSED ON A PHOTOELECTRIC ELEMENT WITH A GROOVE LACATED IN A SECOND REGION OF A SUBSTRATE

(71) Applicant: InnoCare Optoelectronics Corporation, Tainan (TW)

(72) Inventors: Chin-Chi Chen, Tainan (TW); Ting-Yu Chen, Tainan (TW)

(73) Assignee: InnoCare Optoelectronics Corporation, Tainan (TW)

( * ) Notice: Subject to any disclaimer, the term of this patent is extended or adjusted under 35 U.S.C. 154(b) by 0 days.

(21) Appl. No.: 18/184,694

(22) Filed: Mar. 16, 2023

(65) Prior Publication Data

US 2023/0332944 A1   Oct. 19, 2023

(30) Foreign Application Priority Data

Apr. 15, 2022   (CN) .......................... 202210395339.0

(51) Int. Cl.
*H01L 23/60* (2006.01)
*G01J 1/42* (2006.01)

(52) U.S. Cl.
CPC ............... *G01J 1/42* (2013.01); *H01L 23/60* (2013.01)

(58) Field of Classification Search
CPC ....... H01L 27/146; H01L 23/60; H01L 23/58; H01L 24/47; H01L 24/48; H01L 24/49; H01L 24/85; H01L 24/82; G01J 1/02; G01J 1/42

USPC .............................................. 250/239, 214 R
See application file for complete search history.

(56) References Cited

U.S. PATENT DOCUMENTS 11,121,163 B2 *   9/2021   Kim ................. H01L 27/14614

FOREIGN PATENT DOCUMENTS

| CN | 202633313 | 12/2012 |
|---|---|---|
| CN | 109728040 | 5/2019 |

OTHER PUBLICATIONS

"Office Action of Taiwan Counterpart Application", issued on Mar. 22, 2023, p. 1-p. 7.

* cited by examiner

*Primary Examiner* — Que Tan Le
(74) *Attorney, Agent, or Firm* — JCIPRNET (57) ABSTRACT

A detection device including a substrate, a conductive pad, a conductive line, a photoelectric element, and an insulating layer is provided. The substrate includes a first region and a second region surrounding the first region. The conductive pad is disposed on the substrate and is located in the second region. The conductive line is disposed on the substrate and extends from the first region to the second region. The conductive line is coupled with the conductive pad. The photoelectric element is disposed on the substrate and is located in the first region. The photoelectric element is coupled to the conductive line. The insulating layer is disposed on the photoelectric element and extends from the first region to the second region. The insulating layer has a groove, and the groove is located in the second region. A manufacturing method of a detection device is also provided.

20 Claims, 8 Drawing Sheets

FIG. 7F ure are to be made in detail. Examples of the exemplary
DETECTION DEVICE AND MANUFACTURING METHOD THEREOF COMPRISING AN INSULATING LAYER DISPOSED ON A PHOTOELECTRIC ELEMENT WITH A GROOVE LACATED IN A SECOND REGION OF A SUBSTRATE

CROSS-REFERENCE TO RELATED APPLICATION

This application claims the priority benefit of China application serial no. 202210395339.0, filed on Apr. 15, 2022. The entirety of the above-mentioned patent application is hereby incorporated by reference herein and made a part of this specification.

BACKGROUND

Technical Field

The disclosure relates to an electronic device and a manufacturing method thereof, and in particular relates to a detection device and a manufacturing method thereof.

Description of Related Art

Electrostatic discharge (ESD) is one of the main factors causing the failure or damage of most electronic devices. Therefore, the protection against electrostatic discharge has always been an important issue in the production and usage of electronic devices. In order to reduce the damage to an electronic element in the electronic device caused by the electrostatic discharge during the manufacturing process, the electronic element in the working region is coupled with an external protection element as soon as possible. However, if a metal conductive line is used to couple the electronic element and the protection element, when the substrate of the electronic device is cut, the metal conductive line is cut as well, which may cause problems such as slippage of the cutting mechanism, consumption of production capacity, and/or corrosion caused by exposed metal, etc. On the other hand, if the transparent conductive layer in the later stage of the manufacturing process is adopted to couple the electronic element and the protection element, although it facilitates in improving the problems such as slippage of the cutting mechanism, consumption of production capacity, and/or corrosion caused by exposed metal, etc., the electronic element still has poor electrostatic discharge protection in the manufacturing process.

SUMMARY

The disclosure provides a detection device and a manufacturing method thereof, which may help to improve the problems of slippage of the cutting mechanism, consumption of production capacity, and/or corrosion caused by exposed metal, and/or improve the electrostatic discharge protection effect.

According to an embodiment of the disclosure, a detection device includes a substrate, a conductive pad, a conductive line, a photoelectric element, and an insulating layer. The substrate includes a first region and a second region surrounding the first region. The conductive pad is disposed on the substrate and is located in the second region. The conductive line is disposed on the substrate and extends from the first region to the second region. The conductive line is coupled with the conductive pad. The photoelectric element is disposed on the substrate and is located in the first region. The photoelectric element is coupled to the conductive line. The insulating layer is disposed on the photoelectric element and extends from the first region to the second region. The insulating layer has a groove, and the groove is located in the second region.

According to an embodiment of the disclosure, a manufacturing method of a detection device includes the following step. A substrate is provided, in which the substrate includes a first region and a second region surrounding the first region. A conductive pad is formed on the substrate, in which the conductive pad is located in the second region. A conductive line is formed on the substrate, in which the conductive line extends from the first region to the second region, and the conductive line is coupled with the conductive pad. A photoelectric element is formed on the substrate, in which the photoelectric element is located in the first region and is coupled to the conductive line. An insulating layer is formed on the photoelectric element, in which the insulating layer extends from the first region to the second region. The insulating layer in the second region is patterned to form a groove.

In order to make the above-mentioned features and advantages of the disclosure comprehensible, embodiments accompanied with drawings are described in detail below.

BRIEF DESCRIPTION OF THE DRAWING

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 4A to FIG. 4E are partial cross-sectional schematic views of a part of the manufacturing process of a second region of the detection device according to an embodiment of the disclosure.

FIG. 7A to FIG. 7F are partial cross-sectional schematic views of a part of the manufacturing process of a second region of the detection device according to another embodiment of the disclosure.

DETAILED DESCRIPTION OF DISCLOSED EMBODIMENTS

References of the exemplary embodiments of the disclosure are to be made in detail. Examples of the exemplary embodiments are illustrated in the drawings. If applicable, the same reference numerals in the drawings and the descriptions indicate the same or similar parts.

Certain terms may be used throughout the disclosure and the appended patent claims to refer to specific elements. It should be understood by those of ordinary skill in the art that electronic device manufacturers may refer to the same element by different names. The disclosure does not intend to distinguish between elements that have the same function but have different names. In the following description and patent claims, words such as "comprising" and "including" are open-ended words, so they should be interpreted as meaning "including but not limited to . . . ".

In the disclosure, wordings used to indicate directions, such as "up," "down," "front," "back," "left," and "right," merely refer to directions in the accompanying drawings. Therefore, the directional wordings are used to illustrate rather than limit the disclosure. In the accompanying drawings, the drawings illustrate the general features of the methods, structures, and/or materials used in the particular embodiments. However, the drawings shall not be interpreted as defining or limiting the scope or nature covered by the embodiments. For example, the relative sizes, thicknesses, and locations of the layers, regions, and/or structures may be reduced or enlarged for clarity.

A structure (or layer, element, substrate) described in this disclosure is located on/above another structure (or layer, element, substrate), may indicate that the two structures are adjacent and directly connected, or may indicate that the two structures are adjacent but not directly connected. Indirect connection means that there is at least one intermediate structure (or intermediate layer, intermediate element, intermediate substrate, intermediate spacer) between the two structures, the lower surface of one structure is adjacent to or directly connected to the upper surface of the intermediate structure, and the upper surface of another structure is adjacent to or directly connected to the lower surface of the intermediate structure. The intermediate structure may be composed of a single-layer or multi-layer physical structure or a non-physical structure, which is not limited thereto. In the disclosure, when a certain structure is disposed "on" other structures, it may mean that a certain structure is "directly" on other structures, or it means that a certain structure is "indirectly" on other structures, that is, at least one structure is sandwiched between a certain structure and other structures.

The terms such as "first", "second", etc. used in the description and the patent claims are used to modify elements, which do not imply and represent that the (or these) elements have any previous ordinal numbers, and also does not represent the order of a certain element and another element, or the order of the manufacturing method. The use of these ordinal numbers is to only clearly distinguish an element with a certain name from another element with the same name. The same terms may not be used in the patent claims and the description, and accordingly, the first component in the description may be the second component in the patent claims.

The coupling described in the disclosure may refer to direct electrical connection or indirect electrical connection. In the case of a direct electrical connection, the end points of two elements on a circuit directly connect to each other, or connect to each other through a conductive wire. In the case of indirect electrical connection, a switch, a diode, a capacitor, an inductor, a resistor, other suitable elements, or a combination thereof, but not limited therein, is between the end points of two elements on a circuit.

In the disclosure, the thickness, length, and width may be measured by adopting a measurement method such as an optical microscope (OM), and the thickness or width may be measured from a cross-sectional image in an electronic microscope, but not limited thereto. In addition, any two values or directions used for comparison may have certain errors. In addition, the terms "about", "equal to", "equal" or "same", "substantially" or "generally" are interpreted as within 20% of a given value or range, or interpreted as within 10%, 5%, 3%, 2%, 1%, or 0.5% of the given value or range. Furthermore, the terms "a given range is from a first value to a second value", "a given range is within a range from the first value to the second value" means that the given range includes the first value, the second value, and other values in between. If a first direction is perpendicular to a second direction, an angle between the first direction and the second direction may be between 80 degrees and 100 degrees; if the first direction is parallel to the second direction, an angle between the first direction and the second direction may be between 0 degrees and 10 degrees.

It should be noted that, in the following embodiments, the features in several different embodiments may be replaced, reorganized, and mixed to complete other embodiments without departing from the spirit of the disclosure. As long as the features of the various embodiments do not violate the spirit of the disclosure or conflict with one another, they may be mixed and matched arbitrarily.

Unless otherwise defined, all terms (including technical and scientific terms) used herein have the same meaning as commonly understood by one of ordinary skill in the art to which this disclosure belongs. It is understood that these terms, such as those defined in commonly used dictionaries, should be interpreted as having meanings consistent with the relevant art and the background or context of the disclosure, and should not be interpreted in an idealized or overly formal manner, unless otherwise defined in the embodiments of the disclosure.

In the disclosure, an electronic device may include a display device, a backlight device, an antenna device, a sensing/detecting device, or a splicing device, but is not limited thereto. The electronic device may be a bendable or flexible electronic device. The display device may be a non-self-luminous display device or a self-luminous display device. The antenna device may be a liquid crystal antenna device or a non-liquid crystal antenna device, and the sensing/detecting device may be a device for sensing capacitance, light, heat or ultrasonic waves, but not limited thereto. In the disclosure, an electronic device may include electronic elements, and the electronic elements may include passive elements and active elements, such as a capacitor, a resistor, an inductor, a diode, a transistor, and the like. The diode may include a light emitting diode or a photodiode. The light emitting diode may include, for example, an organic light emitting diode (OLED), a mini light emitting diode (mini LED), a micro light emitting diode (micro LED), or a quantum dot light emitting diode (quantum dot LED), but not limited thereto. The splicing device may be, for example, a display splicing device or an antenna splicing device, but not limited thereto. It should be noted that, the electronic device may be any arrangement and combination of the foregoing, but not limited thereto. Hereinafter, the detection device is used as the electronic device or the splicing device to illustrate the disclosure, but the disclosure is not limited thereto.

Figure 1:
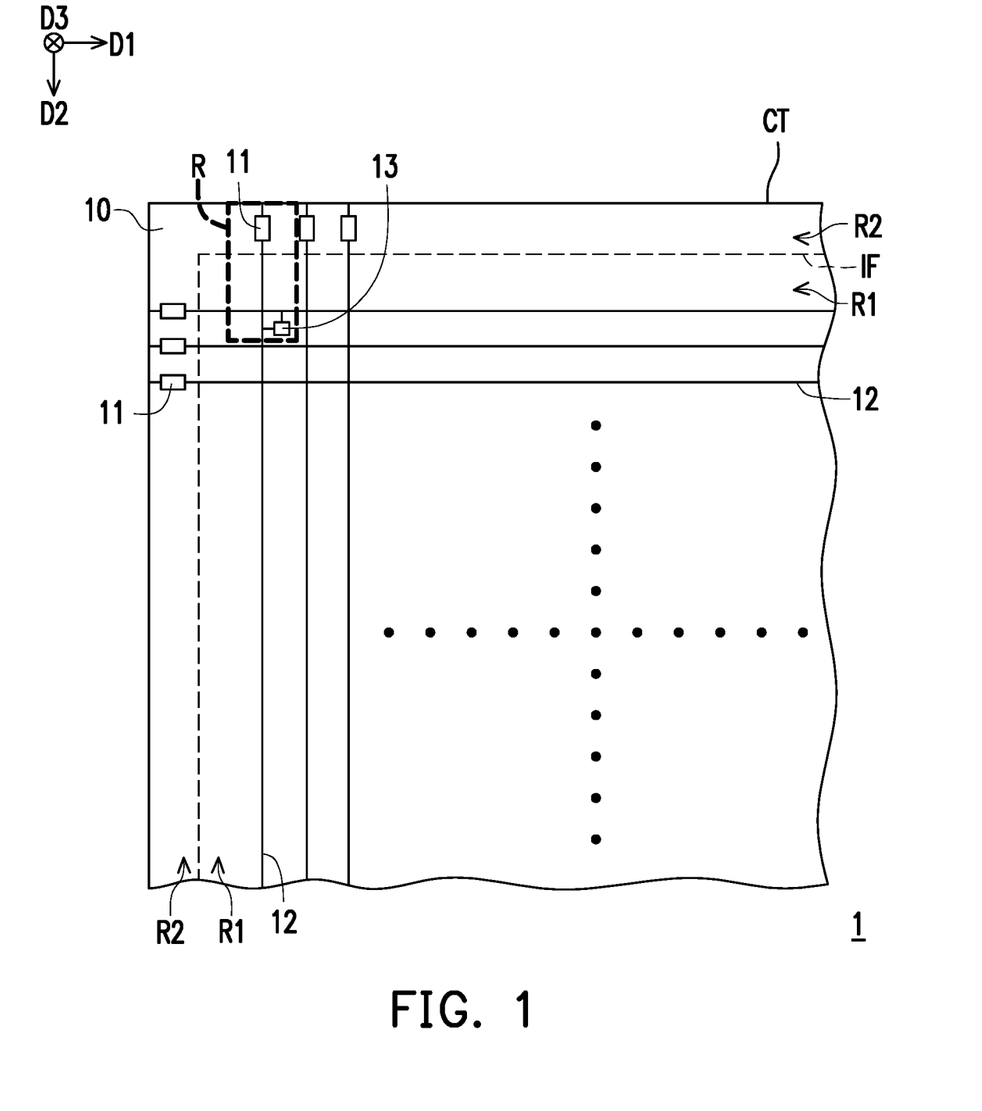
FIG. 1 is a partial top schematic view of a detection device according to an embodiment of the disclosure.
Figure 2:
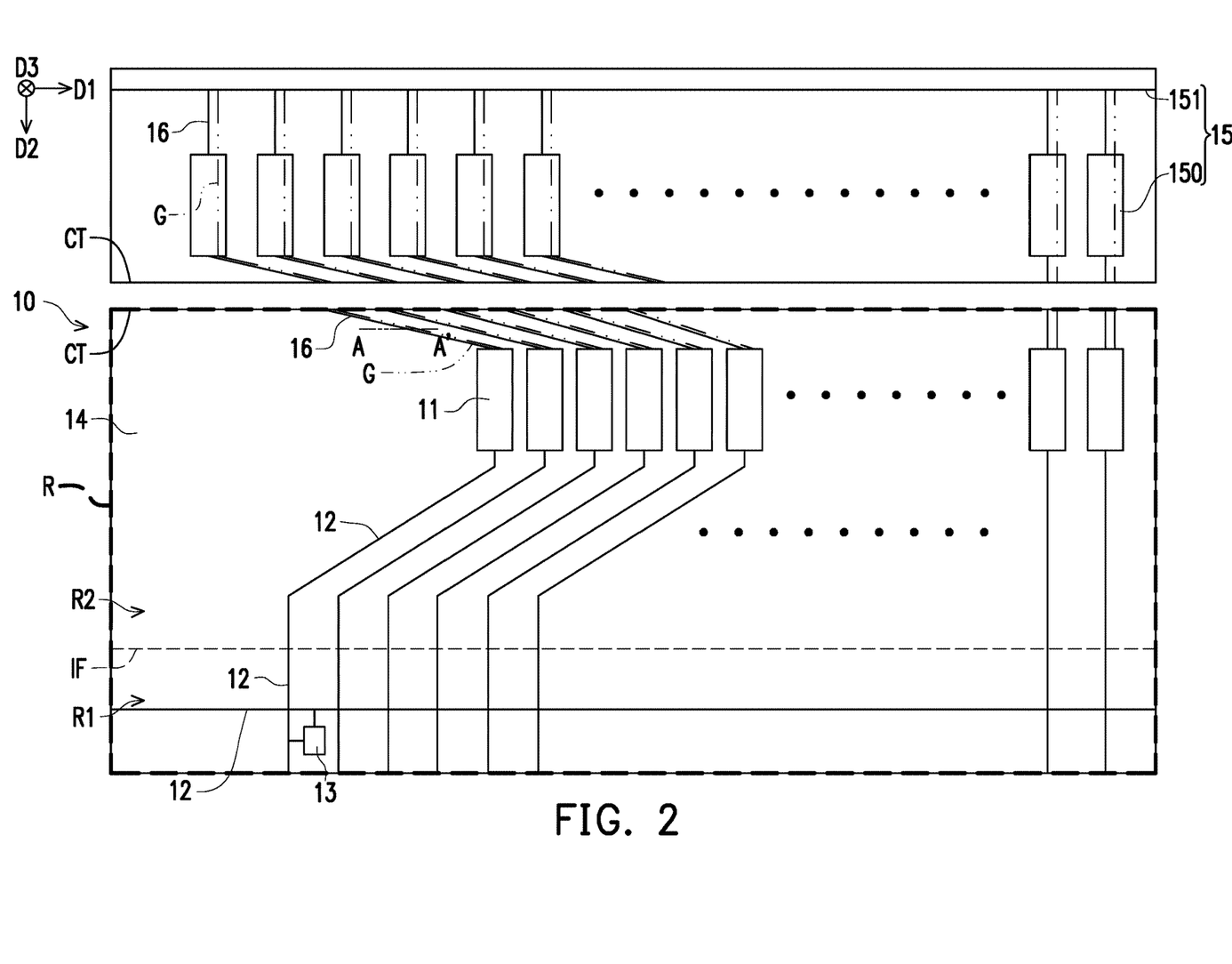
FIG. 2 is an enlarged schematic view of the region R in FIG. 1.
Figure 3:
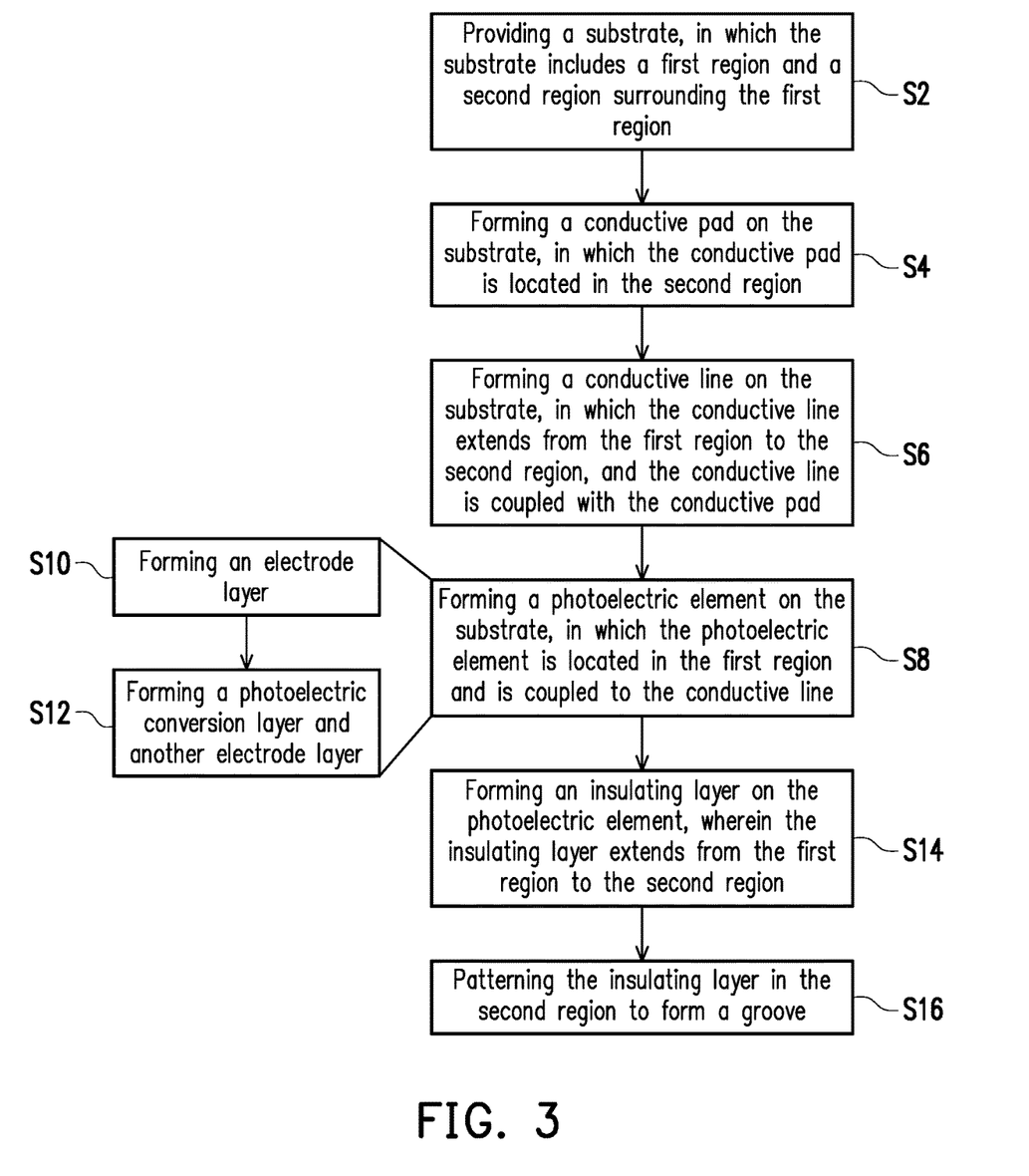
FIG. 3 is a schematic view of a part of the manufacturing process of a detection device according to an embodiment of the disclosure.
Figure 5:
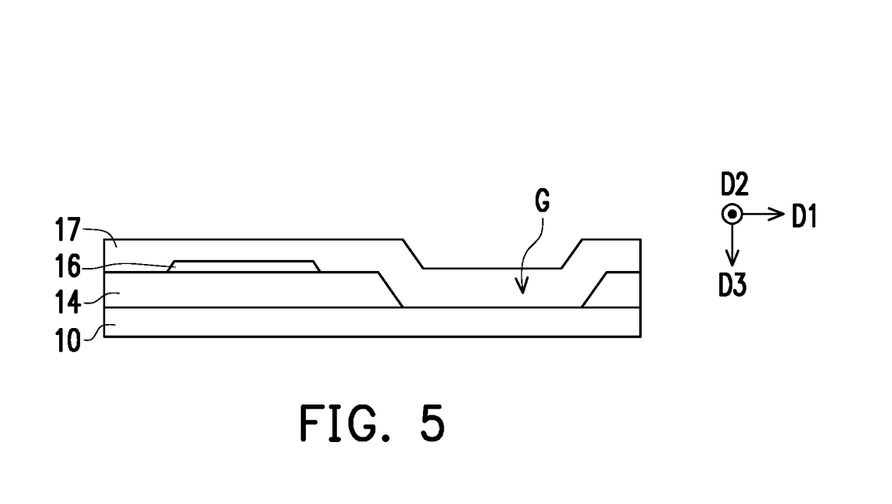
FIG. 5 is a partial cross-sectional schematic view of the second region of the detection device according to an embodiment of the disclosure.
Figure 6:
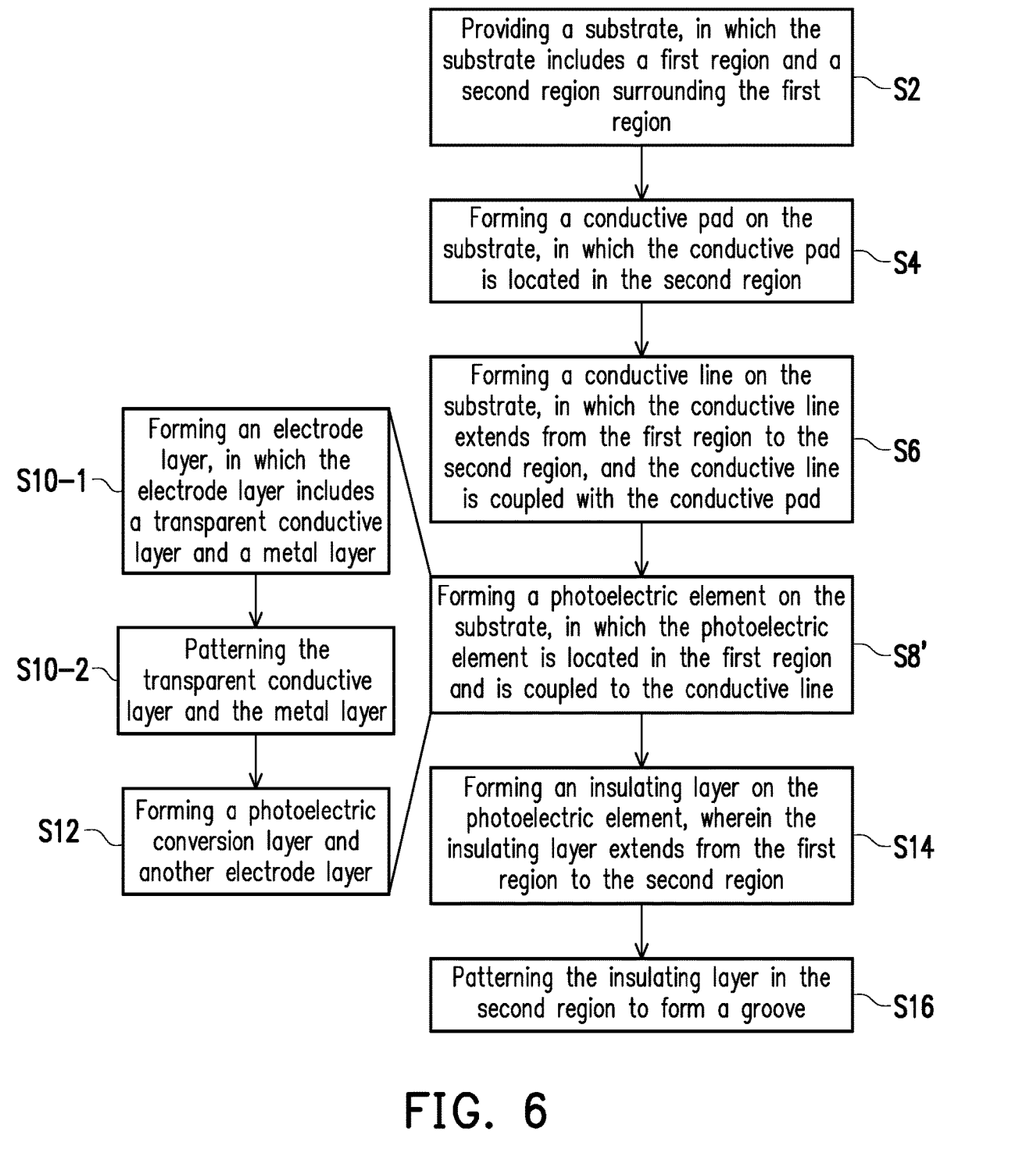
FIG. 6 is a schematic view of a part of the manufacturing process of a detection device according to another embodiment of the disclosure.

FIG. 1 is a partial top schematic view of a detection device according to an embodiment of the disclosure. FIG. 2 is an enlarged schematic view of the region R in FIG. 1. FIG. 3 is a schematic view of a part of the manufacturing process of a detection device according to an embodiment of the disclosure. FIG. 4A to FIG. 4E are partial cross-sectional schematic views of a part of the manufacturing process of a second region of the detection device according to an embodiment of the disclosure. FIG. 5 is a partial cross-sectional schematic view of the second region of the detection device according to an embodiment of the disclosure. FIG. 6 is a schematic view of a part of the manufacturing process of a detection device according to another embodiment of the disclosure. FIG. 7A to FIG. 7F are partial cross-sectional schematic views of a part of the manufacturing process of a second region of the detection device according to another embodiment of the disclosure. The cross-sections shown in FIG. 4A to FIG. 4E, FIG. 5, and FIG. 7A to FIG. 7F are, for example, cross-sections corresponding to the section line A-A' in FIG. 2. In the embodiments shown in FIG. 1 to FIG. 7F, the technical solutions provided by the different embodiments hereinafter may be replaced, combined, or mixed with one another, so as to constitute another embodiment without violating the spirit of the disclosure.

Referring to FIG. 1 and FIG. 2, a detection device 1 may include a substrate 10, a conductive pad 11, a conductive line 12, a photoelectric element 13, and an insulating layer 14. The substrate 10 includes a first region R1 and a second region R2 surrounding the first region R1. The conductive pads 11 are disposed on the substrate 10 in the second region R2. The conductive line 12 is disposed on the substrate 10 and extends from the first region R1 to the second region R2. The conductive line 12 is coupled with the conductive pad 11. The photoelectric element 13 is disposed on the substrate 10 and is located in the first region R1. The photoelectric element 13 is coupled to the conductive line 12. The insulating layer 14 is disposed on the photoelectric element 13 and extends from the first region R1 to the second region R2. The insulating layer 14 has a groove G, and the groove G is located in the second region R2.

In detail, the substrate 10 may be a rigid substrate or a flexible substrate. When the substrate 10 is a hard substrate, the material includes, for example, glass, quartz, ceramic, sapphire, other suitable hard materials, or a combination of the foregoing materials, but not limited thereto. In some embodiments, the substrate 10 may be a flexible substrate, and the material of the substrate 10 may include polycarbonate (PC), polyimide (PI), polypropylene (PP), polyethylene terephthalate (PET), other suitable flexible materials, or a combination of the foregoing materials, but not limited thereto. In addition, the light transmittance of the substrate 10 is not limited, that is, the substrate 10 may be a transparent substrate, a semi-transparent substrate, or a non-transparent substrate.

The first region R1 of the substrate 10 may also be referred to as a working region. In addition to the conductive line 12, the photoelectric element 13, and the insulating layer 14, active elements (not shown), passive elements (not shown), or other circuits (not shown), etc. may also be disposed in the working region, but not limited thereto.

The second region R2 of the substrate 10 may also be referred to as a peripheral region. The peripheral region is, for example, a region other than the working region. In FIG. 1 and FIG. 2, the boundary between the first region R1 and the second region R2 is marked with a thin dotted line IF. In addition to the conductive pad 11, the conductive line 12, and the insulating layer 14, other circuits (not shown) or elements (not shown) may also be disposed in the peripheral region.

Taking FIG. 2 as an example, before the substrate 10 is formed, the upper region of a cutting line CT is connected with the lower region (e.g., the substrate 10) of the cutting line CT. Under this structure, the electronic elements in the working region may be electrically tested by the test pads (not shown), to confirm in advance that the substrate meets the product specifications, thereby improving the yield of the electronic device. After the electrical test, cutting may be performed along the cutting line CT between the conductive pad 11 and an electrostatic protection circuit 15 to form the substrate 10, and the frame width of the detection device 1 may also be reduced. When the substrate 10 is formed by, for example, cutting with a wheel cutter, the upper and lower regions are separated, and the cutting line CT is the edge of the substrate 10. After the substrate 10 is formed, the lower region in FIG. 2 may be coupled with a circuit board or other electronic elements (not shown) and may be assembled with other elements not shown to form the detection device 1. The manufacturing method disclosed in the disclosure is, for example, a step before the substrate is assembled into the detection device, but not limited thereto.

In addition, when the upper region of the cutting line CT is connected with the lower region of the cutting line CT (e.g., the substrate 10), the electrostatic protection circuit 15 and a transparent conductive layer 16 may also be disposed outside of the first region R1 (working region), but not limited thereto. The electrostatic protection circuit 15 may include an electrostatic protection element 150 and a ground line 151, but not limited thereto. Although not shown, the electrostatic protection element 150 may include a test pad (not shown) and a protection element (not shown), and the protection element may include, for example, a back-to-back diode, but not limited thereto. The test pad may be, for example, disposed between the conductive pad 11 and the protection element, the protection element may be, for example, disposed between the test pad and the ground line 151, and the conductive pad 11, the test pad, the protection element, and the ground line 151 are, for example, coupled to each other through the transparent conductive layer 16. The electrostatic discharge during the manufacturing process may be output to the ground line 151 through the conductive line 12, the conductive pad 11, the transparent conductive layer 16, the test pad and the protection element, thereby achieving the purpose of electrostatic discharge protection. In addition, photoelectric elements (not shown) may also be disposed in the peripheral region, but the photoelectric elements are not coupled to at least one of the conductive lines extending along a second direction D2 and the conductive lines extending along a first direction D1.

After cutting is performed to form the substrate 10, the conductive pad 11 may be used for bonding with external circuits (not shown, such as gate driving circuits, source driving circuits, or flexible circuit boards, etc.), to realize the control of the electronic elements (such as active elements) in the first region R1, but not limited thereto. The material of the conductive pad 11 may include, but not limited to, metal, metal alloy, metal oxide, any conductor, or a combination thereof. The metal may include, but not limited to, aluminum, copper, molybdenum, titanium, other suitable materials, or a combination thereof. The metal oxide may include, but not limited to, indium tin oxide, zinc aluminum oxide, zinc tin oxide, indium gallium oxide, or indium tin zinc oxide. The active element may include a gate and a semiconductor, and the semiconductor may include a drain region, a source region and a channel region, and the channel region is located between the drain region and the source region. In addition, a drain electrode and a source electrode may also be included, and the drain electrode and the source electrode are respectively coupled to the drain region and the source region of the semiconductor.

For example, although not shown, the conductive pad 11 may be a single-layer structure of a transparent conductive layer (e.g., a metal oxide layer), or a multi-layer stack structure of a transparent conductive layer and a metal layer. The transparent conductive layer may cover the metal layer, that is, the metal layer is disposed between the transparent conductive layer and the substrate 10 to protect the metal layer and/or reduce the probability of oxidation of the metal layer. In some embodiments, the metal layer of the conductive pad 11 may be the same layer (e.g., the second conductive layer) as the source electrode and/or the drain electrode disposed on the substrate 10 or the same layer (e.g., the first conductive layer) as the gate electrode in the active device, and the transparent conductive layer of the conductive pad 11 may be the topmost transparent conductive layer disposed on the substrate 10, but not limited thereto.

The detection device 1 may include multiple conductive pads 11. Multiple conductive pads 11 may be arranged along the edge of the substrate 10. As shown in FIG. 1 and FIG. 2, the conductive pads 11 disposed in the second region R2 adjacent to the upper edge of the first region R1 are arranged, for example, along the first direction D1, and the conductive pads 11 are respectively coupled to multiple conductive lines 12 extending along the second direction D2. The metal layer of the conductive pads 11 may be, for example, the same layer (e.g., the second conductive layer) as the source electrode and/or the drain electrode disposed on the substrate 10, but not limited thereto. On the other hand, the conductive pads 11 disposed in the second region R2 adjacent to the left edge of the first region R1 are arranged, for example, along the second direction D2, and the conductive pads 11 are respectively coupled to the conductive lines 12 extending along the first direction D1. The metal layer of the conductive pads 11 may be, for example, the same layer (e.g., the first conductive layer) as the gate in the active element disposed on the substrate 10, but not limited thereto. The first direction D1 and the second direction D2 are different and intersect with each other, such as being perpendicular to each other, but not limited thereto.

The conductive line 12 may be configured to transmit electrical signals and/or conduct static electricity out of the first region R1. For example, the conductive line 12 may be a gate line or a data line, but not limited thereto. The material of the conductive line 12 may include, but not limited to, metal, metal alloy, metal oxide, other suitable materials, or a combination thereof. In some embodiments, the conductive line 12 may be formed of a material with high conductivity such as metal or metal alloy to reduce impedance and/or facilitate signal transmission. In some embodiments, the conductive line 12 and the metal layer of the conductive pad 11 may be the same layer (e.g., the first conductive layer or the second conductive layer), but not limited thereto.

In some embodiments, the conductive line 12 and the transparent conductive layer 16 may be formed of different materials and different processes. For example, the conductive line 12 may be formed together with the gate electrode in the active device or formed together with the source electrode and/or the drain electrode. The transparent conductive layer 16 may be formed after the conductive line 12, for example, the transparent conductive layer 16 may be formed together with the transparent conductive layer of the conductive pad 11, and the transparent conductive layer 16 may also be formed before the transparent conductive layer of the conductive pad 11. The transparent conductive layer 16 includes a transparent conductive material. The transparent conductive material may include, but not limited to, metal oxide (e.g., indium tin oxide), carbon nanotube, graphene, other suitable materials, or a combination thereof.

By manufacturing the transparent conductive layer 16 connecting the conductive pad 11 and the electrostatic protection circuit 15 with a transparent conductive material, the number of metal conductive lines that is passed through when cutting along the cutting line CT to form the substrate 10 may be reduced, thereby facilitating in improving the problems of slippage of the cutting mechanism, consumption of production capacity, and/or corrosion caused by exposed metal, and/or improve the electrostatic discharge protection effect.

The photoelectric element 13 may be configured to convert optical signals into electrical signals or convert electrical signals into optical signals. For example, the detection device 1 may be an X-ray device, and the detection device 1 may further include a scintillator layer (not shown). The scintillator layer is provided on the substrate 10 and may convert X-rays into visible light. The material of the scintillator layer may include cesium iodide (CsI), other types of inorganic scintillator material, or organic scintillator material. The photoelectric element 13 may receive the visible light from the scintillator layer and convert the visible light into electrical signals, and transmit the electrical signals through the conductive lines 12.

Although not shown, the photoelectric element 13 may include a bottom electrode, a photoelectric conversion layer and a top electrode sequentially stacked on the substrate 10, but not limited thereto. The bottom electrode may be coupled to the corresponding conductive line 12 through the corresponding active element. For example, the bottom electrode, for example, belongs to the third conductive layer, in which there may be one or more insulating layers between the third conductive layer and the second conductive layer. The bottom electrode may be coupled to the active element through a via hole penetrating the one or more insulating layers, and then coupled to the conductive line 12, but not limited to this. The photoelectric conversion layer is disposed on the bottom electrode and is suitable for receiving visible light and generating corresponding electrical signals. For example, the photoelectric conversion layer may include a stacked layer structure of a P-type semiconductor layer and an N-type semiconductor layer, but not limited thereto. In some embodiments, the photoelectric conversion layer may further include an intrinsic semiconductor layer or a low-doped P-type semiconductor layer, and the intrinsic semiconductor layer or the low-doped P-type semiconductor layer may be disposed between a P-type semiconductor layer and an N-type semiconductor layer. The top electrode is disposed on the photoelectric conversion layer and, for example, belongs to the fourth conductive layer. The top electrode of the photoelectric element 13 is disposed correspondingly to the bottom electrode of the photoelectric element 13, which means that the top electrode and the bottom electrode at least partially overlap in the normal direction (e.g., a third direction D3) of the substrate 10.

Viewed from the top view direction of the electronic device (such as the third direction D3), the top electrode is disposed on the front side of the photoelectric conversion layer, so the material of the top electrode (the material of the fourth conductive layer) adopts a transparent conductive material to facilitate the photoelectric conversion layer to receive visible light. For example, the material of the fourth conductive layer may include indium tin oxide, other metal oxides, other suitable light-transmitting conductive materials, or a combination thereof, but not limited thereto.

Viewed from the top view direction of the electronic device (such as the third direction D3), the bottom electrode is disposed on the back side of the photoelectric conversion layer, so the material of the bottom electrode (the material of the third conductive layer) may be either a transparent conductive material or an opaque conductive material. For example, the material of the third conductive layer may include, metal oxide (e.g., indium tin oxide), metal, metal alloy, other suitable materials, or a combination of at least two of the foregoing materials, but not limited thereto. When the material of the third conductive layer includes an opaque conductive material, for example, when the bottom electrode includes a metal electrode, the bottom electrode may reflect the visible light transmitted toward the substrate 10, thereby facilitating in improving the absorption of visible light by the photoelectric conversion layer.

In addition to being disposed on the photoelectric elements 13, the insulating layer 14 may also be disposed on the electronic element (such as the active element, the passive element, or other circuits, etc.) in the first region R1. The material of the insulating layer 14 may include inorganic insulating material, organic insulating material or a combination thereof, but not limited thereto.

In some embodiments, as shown in FIG. 3, a manufacturing method of a detection device 1 includes the following step. A substrate 10 is provided, in which the substrate 10 includes a first region R1 and a second region R2 surrounding the first region R1 (step S2). A conductive pad 11 is formed on the substrate 10, in which the conductive pad 11 is located in the second region R2 (step S4). A conductive line 12 is formed on the substrate 10, in which the conductive line 12 extends from the first region R1 to the second region R2, and the conductive line 12 is coupled with the conductive pad 11 (step S6). A photoelectric element 13 is formed on the substrate 10, in which the photoelectric element 13 is located in the first region R1 and is coupled to the conductive line 12 (step S8). An insulating layer 14 is formed on the photoelectric element 13, in which the insulating layer 14 extends from the first region R1 to the second region R2 (step S14). The insulating layer 14 in the second region R2 is patterned to form a groove G (step S16), but not limited thereto.

Figure 4A:
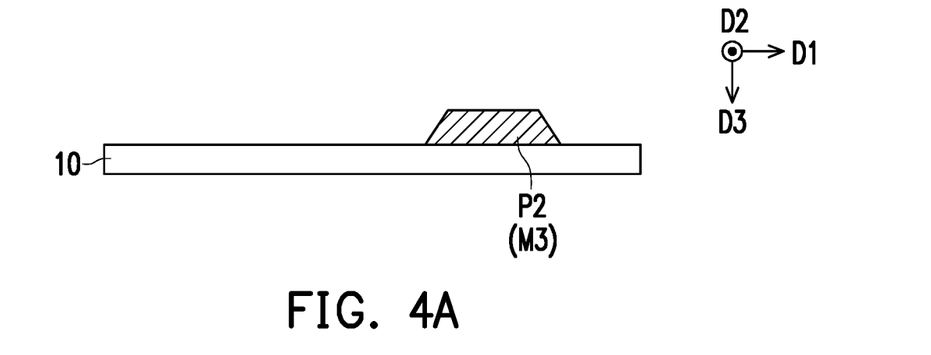

As shown in FIG. 3 and FIG. 4A, forming the photoelectric element 13 may further include forming an electrode layer M3 (step S10). The electrode layer M3 is, for example, a patterned conductive layer to which the bottom electrode of the photoelectric element 13 belongs, such as the third conductive layer. The electrode layer M3 includes a first portion (not shown, for example, the bottom electrode of the photoelectric element 13) and a second portion P2.

The first portion is located in the first region R1 and is coupled to the conductive line 12 (referring to the photoelectric element 13 in FIG. 2). For example, the first portion may be formed after the conductive line 12, and there may be one or more insulating layers between the first portion and the conductive line 12, in which the first portion may be coupled to the active element first and then coupled to the conductive line 12 through the via hole penetrating the one or more insulating layers.

The second portion P2 is located in the second region R2 and is coupled to the conductive pad 11 (the conductive pad 11 is not shown in FIG. 4A, please refer to FIG. 2). For example, the second portion P2 may be formed after the conductive pad 11, and there may be one or more insulating layers between the second portion P2 and the conductive pad 11, in which the second portion P2 may be coupled to the conductive pad 11 through a via hole passing through the one or more insulating layers.

In some embodiments, before the substrate 10 is formed, the upper region of a cutting line CT is connected with the lower region (e.g., the substrate 10) of the cutting line CT. For example, the second portion P2 may couple the conductive pad 11 to the electrostatic protection element 150 first and then to the ground line 151, thus the conductive pad 11, the electrostatic protection element 150, and the ground line 151 may be coupled. After the electrode layer M3 is formed, the conductive line 12 coupled between the active element/photoelectric element 13 and the conductive pad 11 and the second portion P2 coupled between the conductive pad 11 and the electrostatic protection circuit 15 may be used to improve the capability of electrostatic discharge protection.

It should also be understood that although not shown in FIG. 4A to FIG. 4E, one or more insulating layers may exist between the second portion P2 and the substrate 10, but not limited thereto.

Forming the photoelectric element 13 may further include forming a photoelectric conversion layer and another electrode layer (step S12). The other electrode layer refers to a conductive layer, such as a fourth conductive layer, that may be used to form the top electrode of the photoelectric element 13. Specifically, the photoelectric conversion layer and the top electrode may be sequentially formed on the bottom electrode in the first region R1.

Figure 4B:
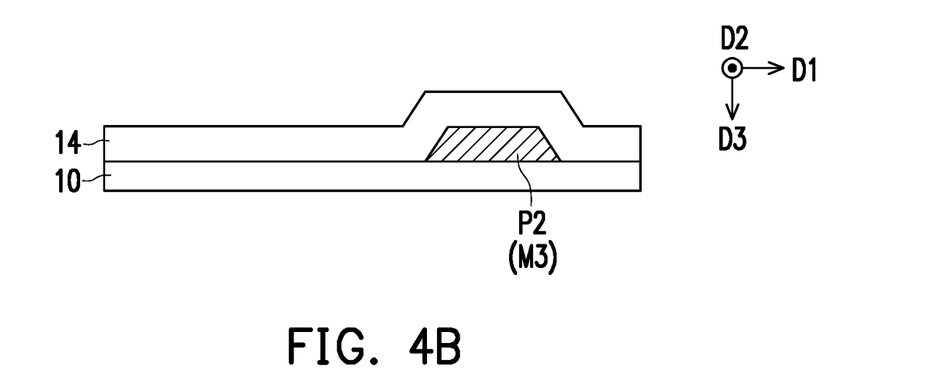
Figure 4C:
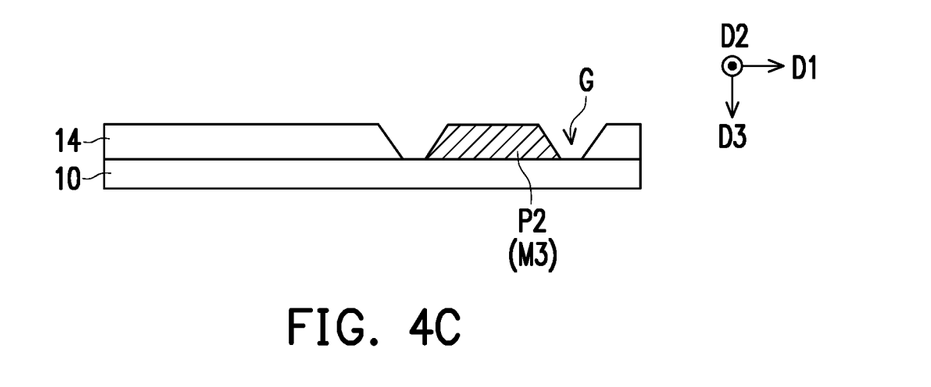

Next, the insulating layer 14 is formed (step S14) and the insulating layer 14 in the second region R2 is patterned to form the groove G (step S16), that is, the groove G is formed after the second portion P2 of the electrode layer M3. As shown in FIG. 4B and FIG. 4C, after the foregoing patterning step, the groove G of the insulating layer 14 exposes the second portion P2 of the electrode layer M3, in other words, the second portion P2 of the electrode layer M3 is not shaded by the insulating layer 14 after the foregoing patterning step.

Then, another conductive line is formed (step S18). The other conductive line (not shown) is coupled to the photoelectric element 13. For example, the other conductive line is a conductive line coupled to the top electrode of the photoelectric element 13. In some embodiments, the other conductive line may be coupled to a fixed level to keep the top electrode of the photoelectric element 13 at the fixed level, but not limited thereto. In some embodiments, the other conductive line, for example, belongs to the fifth conductive layer, in which there may be one or more insulating layers (including the insulating layer 14) between the other conductive line and the top electrode of the photoelectric element 13, and the other conductive line may be coupled to the top electrode of the photoelectric element 13 through a via hole penetrating the one or more insulating layers. In some embodiments, the fifth conductive layer may be formed of metal or metal alloy, but not limited thereto. Forming the other conductive line may include forming a fifth conductive layer (not shown) first, and then patterning the fifth conductive layer to form the other conductive line. In addition, when patterning the fifth conductive layer, multiple pattern blocks (not shown) may also be formed, and the pattern blocks may be disposed corresponding to multiple active elements, for example, the pattern blocks and the active elements overlap in the third direction D3 to reduce the interference of an external light beam to the active element.

Figure 4D:
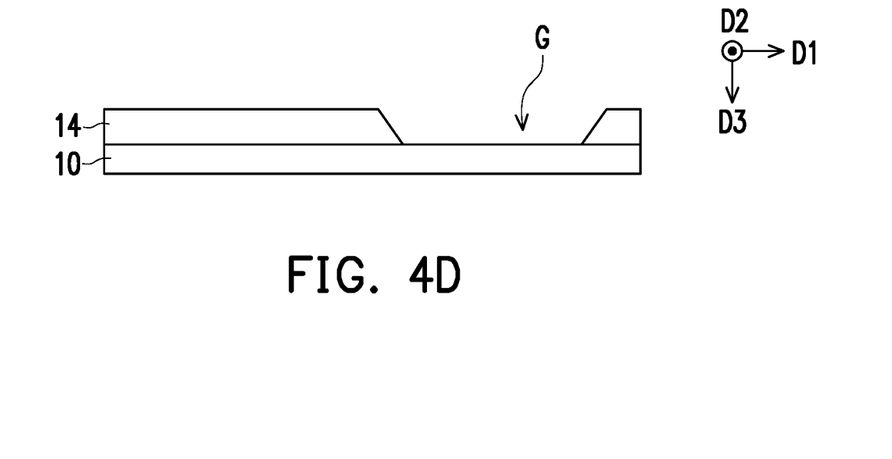

As shown in FIG. 4D, while the fifth conductive layer is patterned to form the other conductive line, the second portion P2 of the electrode layer M3 may be removed. Specifically, since the groove G of the insulating layer 14 exposes the second portion P2 of the electrode layer M3 before the fifth conductive layer is patterned, the second portion P2 may also be removed in the step of patterning the fifth conductive layer.

Figure 4E:
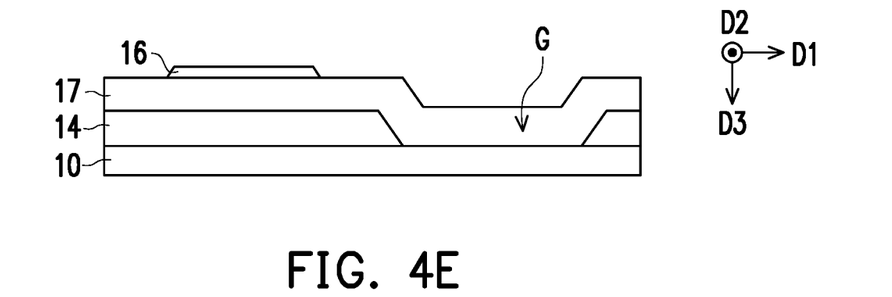

In some embodiments, as shown in FIG. 4E, an insulating layer 17 may also be formed on the substrate 10, in which the insulating layer 17 is disposed on the insulating layer 14 and fills the groove G. Next, the transparent conductive layer 16 may also be formed on the insulating layer 17. After the transparent conductive layer 16 is formed, the transparent conductive layer 16 is coupled to the conductive pad 11 and the electrostatic protection circuit 15, to reduce the influence of electrostatic discharge on the detection device.

In some embodiments, as shown in FIG. 4E, the transparent conductive layer 16 is disposed on the insulating layer 14 and the insulating layer 17, and is adjacent to the groove G. The transparent conductive layer 16 may not overlap with the groove G in the third direction D3. It should be understood that the relative arrangement relationship between the transparent conductive layer 16 and other film layers may be changed according to requirements, but not limited thereto. For example, as shown in FIG. 5, the transparent conductive layer 16 may also be disposed between the insulating layer 14 and the insulating layer 17, but not limited thereto.

Figure 7A:
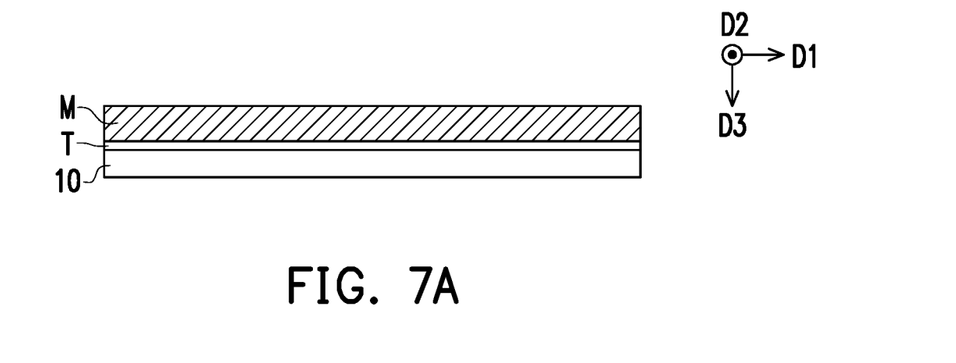
Figure 7B:
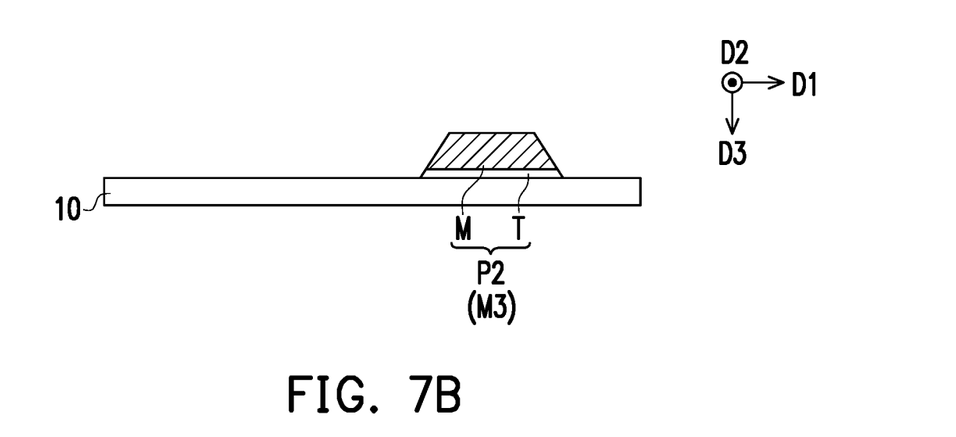
Figure 7C:
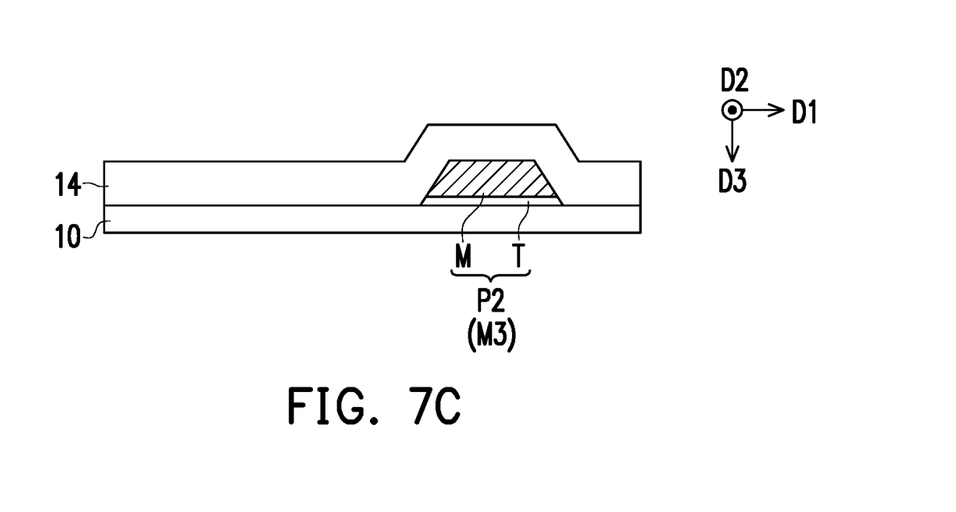
Figure 7D:
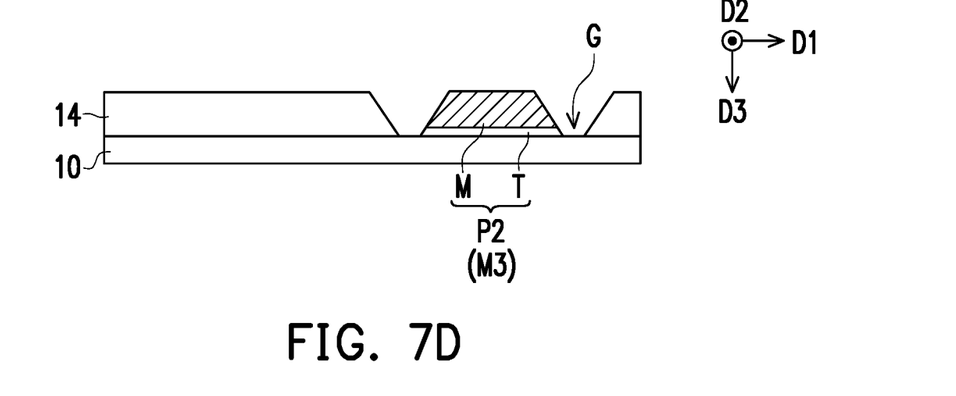

In other embodiments, as shown in FIG. 6, FIG. 7A, and FIG. 7B, the step S8' of forming the photoelectric element may include step S10-1, step S10-2, and step S12. In detail, forming the electrode layer M3 may include sequentially forming a transparent conductive layer T and a metal layer M (step S10-1), and patterning the transparent conductive layer T and the metal layer M (step S10-2). In other words, the electrode layer M3 (the third conductive layer) is a stacked structure of the transparent conductive layer T and the metal layer M, and each of the first portion and the second portion P2 of the electrode layer M3 includes the transparent conductive layer T and the metal layer M. Next, as shown in FIG. 7C and FIG. 7D, step S12 to step S16 are performed to form the groove G.

Figure 7E:
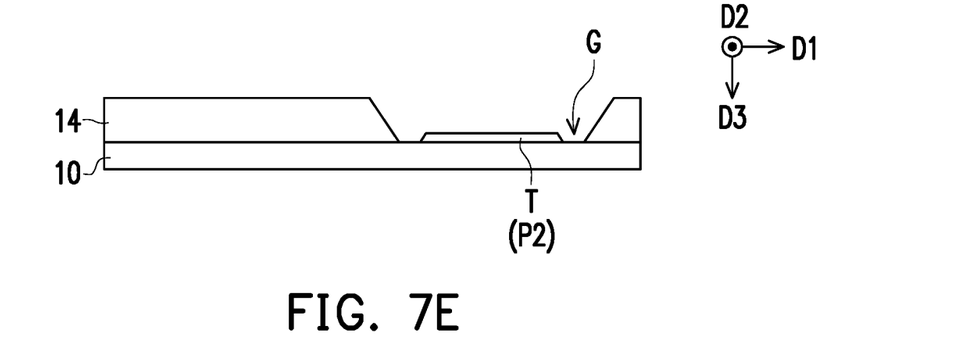
Figure 7F:
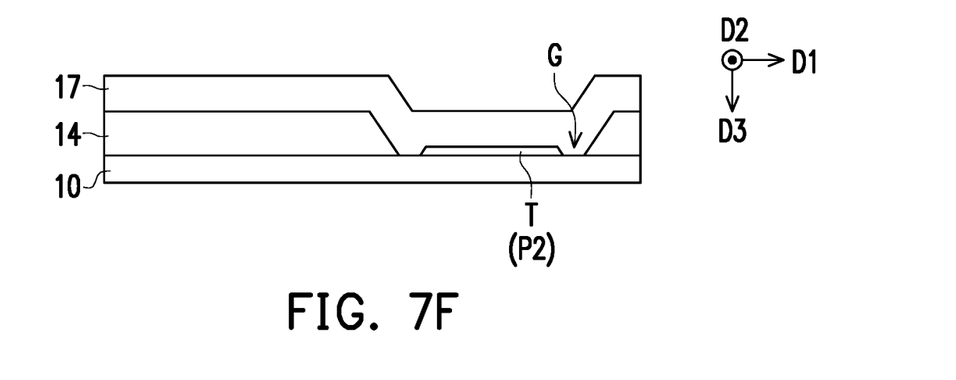

Then, another conductive line is formed (step S18). As shown in FIG. 7E, while forming the other conductive line, the metal layer M of the second portion P2 may be removed (e.g., etched) and the transparent conductive layer T of the second portion P2 may remain. Next, an insulating layer 17 may subsequently be formed on the insulating layer 14. The insulating layer 17 fills the groove G and covers the transparent conductive layer T disposed in the groove G.

Before removing the metal layer M of the second portion P2, the transparent conductive layer T and the metal layer M of the second portion P2 are coupled between the conductive pad 11 and the electrostatic protection circuit 15 to reduce the influence of electrostatic discharge. After the metal layer M of the second portion P2 is removed, since the transparent conductive layer T of the second portion P2 is still coupled between the conductive pad 11 and the electrostatic protection circuit 15, the influence of electrostatic discharge may still be reduced.

Under this structure, the transparent conductive layer T of the second portion P2 may be used to continuously reduce the influence of electrostatic discharge. Since the transparent conductive layer T of the second portion P2 may be used as the transparent conductive layer coupling the conductive pad 11 and the electrostatic protection circuit 15 in FIG. 2, it is not necessary to additionally form the transparent conductive layer 16 shown in FIG. 4E and FIG. 5. Under this structure, it may be considered that the transparent conductive layer is disposed in the groove G, that is, the transparent conductive layer overlaps with the groove G in the normal direction (or the top view direction, such as the third direction D3) of the substrate 10. In another embodiment, as shown in FIG. 4E and FIG. 5, a transparent conductive layer may be additionally formed to improve the electrostatic discharge protection effect.

To sum up, in the embodiments of the disclosure, the problems of slippage of the cutting mechanism, consumption of production capacity, and/or corrosion caused by exposed metal, may be improved by removing the metal conductive lines located on the cutting line, and/or the electrostatic discharge protection effect may be taken into account through special wiring design.

The foregoing embodiments are only used to illustrate the technical solutions of the disclosure, but not to limit the disclosure; although the disclosure has been described in detail with reference to the foregoing embodiments, persons of ordinary skill in the art should understand that the technical solutions described in the foregoing embodiments may still be modified, or parts or all of the technical features thereof may be equivalently replaced; however, these modifications or substitutions do not deviate the essence of the corresponding technical solutions from the scope of the technical solutions of the embodiments of the disclosure.

Although the embodiments of the disclosure and the advantages thereof have been disclosed above, it should be understood that any person with ordinary skill in the art may make changes, substitutions, and modifications without departing from the spirit and scope of the disclosure, and the features of the various embodiments may be arbitrarily mixed and replaced with one another to form other new embodiments. In addition, the protection scope of the disclosure is not limited to the processes, machines, manufactures, compositions of the matter, devices, methods, and steps in the specific embodiments described in the specification. It is understood that processes, machines, manufactures, compositions of matter, devices, methods, and steps developed in the present or in the future may be used in accordance with the disclosure as long as they may implement substantially the same functions or achieve substantially the same results in the embodiments described herein. Therefore, the protection scope of the disclosure includes the above-mentioned processes, machines, manufactures, compositions of matter, devices, methods, and steps. In addition, each of the claims constitutes a separate embodiment, and the protection scope of the disclosure also includes each of the combinations of the claims and the embodiments. The protection scope of the disclosure shall be determined by the appended patent claims.

What is claimed is:

1. A detection device, comprising:
   a substrate, comprising a first region and a second region surrounding the first region;
   a conductive pad, disposed on the substrate and located in the second region;
   a conductive line, disposed on the substrate and extending from the first region to the second region, wherein the conductive line is coupled with the conductive pad;
   a photoelectric element, disposed on the substrate and located in the first region, wherein the photoelectric element is coupled to the conductive line; and
   an insulating layer, disposed on the photoelectric element and extending from the first region to the second region, wherein the insulating layer has a groove, and the groove is located in the second region.

2. The detection device according to claim 1, further comprising:

a transparent conductive layer, coupled to the conductive pad.

3. The detection device according to claim 2, wherein the transparent conductive layer is disposed in the groove.

4. The detection device according to claim 3, further comprising:
   another insulating layer, disposed on the insulating layer and filling the groove, wherein the transparent conductive layer is disposed between the another insulating layer and the substrate.

5. The detection device according to claim 2, wherein the transparent conductive layer is disposed on the insulating layer and is adjacent to the groove.

6. The detection device according to claim 5, further comprising:
   another insulating layer, disposed on the insulating layer and filling the groove, wherein the transparent conductive layer is disposed on the another insulating layer.

7. The detection device according to claim 5, further comprising:
   another insulating layer, disposed on the insulating layer and filling the groove, wherein the transparent conductive layer is disposed between the insulating layer and the another insulating layer.

8. The detection device according to claim 2, wherein a material of the transparent conductive layer comprises indium tin oxide.

9. The detection device according to claim 2, wherein the transparent conductive layer is a patterned conductive layer, and the transparent conductive layer extends from the conductive pad to an edge of the substrate along an extending direction of the groove.

10. The detection device according to claim 2, wherein the transparent conductive layer is coupled to the photoelectric element through the conductive pad and the conductive line.

11. A manufacturing method for a detection device, comprising:
    providing a substrate, the substrate comprising a first region and a second region surrounding the first region;
    forming a conductive pad on the substrate, wherein the conductive pad is located in the second region;
    forming a conductive line on the substrate, wherein the conductive line extends from the first region to the second region, and the conductive line is coupled with the conductive pad;
    forming a photoelectric element on the substrate, wherein the photoelectric element is located in the first region and is coupled to the conductive line;
    forming an insulating layer on the photoelectric element, wherein the insulating layer extends from the first region to the second region; and
    patterning the insulating layer in the second region to form a groove.

12. The manufacturing method according to claim 11, wherein forming the photoelectric element comprises forming an electrode layer, the electrode layer comprises a first portion and a second portion, the first portion is located in the first region and is coupled to the conductive line, and the second portion is located in the second region and is coupled to the conductive pad.

13. The manufacturing method according to claim 12, wherein the groove is formed after the second portion of the electrode layer.

14. The manufacturing method according to claim 12, wherein the second portion is coupled to the photoelectric element through the conductive pad and the conductive line.

15. The manufacturing method according to claim 12, wherein the groove exposes the second portion.

16. The manufacturing method according to claim 12, further comprising:
    forming another conductive line on the photoelectric element, wherein the another conductive line is coupled to the photoelectric element; and
    removing the second portion of the electrode layer while forming the another conductive line.

17. The manufacturing method according to claim 16, further comprising:
    forming another insulating layer after forming the another conductive line, wherein the another insulating layer is disposed on the insulating layer and fills the groove; and
    forming a transparent conductive layer on the another insulating layer, wherein the transparent conductive layer is couple to the conductive pad.

18. The manufacturing method according to claim 16, further comprising:
    forming a transparent conductive layer on the insulating layer, wherein the transparent conductive layer is coupled to the conductive pad; and
    forming another insulating layer on the transparent conductive layer and the insulating layer, the another insulating layer filling the groove.

19. The manufacturing method according to claim 12, wherein each of the first portion and the second portion comprises a metal layer and a transparent conductive layer, the manufacturing method further comprising:
    forming another conductive line on the photoelectric element, wherein the another conductive line is coupled to the photoelectric element; and
    removing the metal layer of the second portion while forming the another conductive line.

20. The manufacturing method according to claim 19, further comprising:
    forming another insulating layer on the insulating layer, the another insulating layer filling the groove and covering the transparent conductive layer of the second portion located in the groove.

* * * * *